US008587466B2

(12) United States Patent
Debnath et al.

(10) Patent No.: US 8,587,466 B2
(45) Date of Patent: Nov. 19, 2013

(54) SYSTEM AND METHOD FOR A SUCCESSIVE APPROXIMATION ANALOG TO DIGITAL CONVERTER

(75) Inventors: Chandrajit Debnath, Greater Noida UP (IN); Mohit Kaushik, MuzaffarNagar (IN)

(73) Assignee: STMicroelectronics International N.V., Amsterdam (NL)

( * ) Notice: Subject to any disclaimer, the term of this patent is extended or adjusted under 35 U.S.C. 154(b) by 14 days.

(21) Appl. No.: 13/339,778

(22) Filed: Dec. 29, 2011

(65) Prior Publication Data

US 2013/0169454 A1    Jul. 4, 2013

(51) Int. Cl.
*H03M 1/34*        (2006.01)
(52) U.S. Cl.
USPC .......................................... 341/163; 341/155
(58) Field of Classification Search
USPC .................... 341/155, 161–163, 159, 172
See application file for complete search history.

(56) References Cited

U.S. PATENT DOCUMENTS

| 4,907,002 | A  | * | 3/1990  | Kawada .................. | 341/172 |
| 6,664,911 | B2 | * | 12/2003 | Hirai ...................... | 341/159 |
| 6,731,232 | B1 | * | 5/2004  | Kearney ................. | 341/163 |
| 6,958,722 | B1 | * | 10/2005 | Janakiraman et al. .. | 341/161 |
| 7,439,898 | B1 | * | 10/2008 | Nittala et al. ........... | 341/163 |
| 2009/0009373 | A1 | * | 1/2009 | Yoshinaga ............. | 341/143 |
| 2009/0102694 | A1 | * | 4/2009 | Nittala et al. .......... | 341/165 |

OTHER PUBLICATIONS

Degerli, et al., "Low-Power Autozeroed High-Speed Comparator for the Readout Chain of a CMOS Monolithic Active Pixel Sensor Based Vertex Detector," IEEE Transactions on Nuclear Science, vol. 50, No. 5, pp. 1709-1717, Oct. 2003.
Tutorial 1080, "Understanding SAR ADCs: Their Architecture and Comparison with Other ADCs," www.maxim-ic.com/app-notes/index.mvp/id/1080/CMP/WP-50, 5 pages, Oct. 2001.

* cited by examiner

*Primary Examiner* — Jean B Jeanglaude
(74) *Attorney, Agent, or Firm* — Slater & Matsil, L.L.P.

(57) ABSTRACT

In accordance with an embodiment, a method of performing a successive approximation analog-to-digital (A/D) conversion includes determining a voltage range of an analog input voltage in a single cycle using a multi-bit flash A/D converter, determining an initial D/A value for a successive approximation based on determining the voltage range, and successively approximating the analog input voltage. Successively approximating includes providing the initial D/A value to a D/A converter, comparing an output of the D/A converter with the analog input voltage, and determining a further D/A value based on the comparing.

24 Claims, 6 Drawing Sheets

| Comparator Output Bits | | | | DAC Bits ( In First Conversion Cycle ) | | | | | | | | | | | |
|---|---|---|---|---|---|---|---|---|---|---|---|---|---|---|---|
| C3 | C2 | C1 | C0 | B11 | B10 | B9 | B8 | B7 | B6 | B5 | B4 | B3 | B2 | B1 | B0 |
| Case 1.  0 | 0 | 0 | 0 | 0 | 0 | 1 | 0 | 0 | 0 | 0 | 0 | 0 | 0 | 0 | 0 |
| Case 2.  0 | 0 | 0 | 1 | 0 | 1 | 0 | 0 | 0 | 0 | 0 | 0 | 0 | 0 | 0 | 0 |
| Case 3.  0 | 0 | 1 | 1 | 1 | 0 | 0 | 0 | 0 | 0 | 0 | 0 | 0 | 0 | 0 | 0 |
| Case 4.  0 | 1 | 1 | 1 | 1 | 1 | 0 | 0 | 0 | 0 | 0 | 0 | 0 | 0 | 0 | 0 |
| Case 5.  1 | 1 | 1 | 1 | 1 | 1 | 1 | 0 | 0 | 0 | 0 | 0 | 0 | 0 | 0 | 0 |

SYSTEM AND METHOD FOR A SUCCESSIVE APPROXIMATION ANALOG TO DIGITAL CONVERTER

TECHNICAL FIELD

This invention relates generally to semiconductor circuits and methods, and more particularly to a system and method for a successive approximation analog to digital converter.

BACKGROUND

Analog-to-digital (A/D) converters are commonly used in microelectronics systems to convert real-world analog signals into digital signals that can be processed by digital systems such as computers digital audio and video systems and wireless communication systems. A/D converters may be implemented as standalone semiconductor devices, or integrated along with other circuitry on a single integrated circuit. While a today, converters may be implemented using a number of different architectures, the successive approximation A/D converter is widely used in applications that require medium speed and resolution, for example, measuring multiple DC inputs in a test or measurement system, or performing an A/D conversion of an audio signal.

A typical successive approximation A/D converter converts an analog signal to a digital signal by comparing various output values of digital to analog (D/A) converter with the analog input signal over the course of a number of clock cycles. For example, in a first conversion cycle the most significant bit (MSB) is determined by comparing the analog input signal with the mid-scale output of the D/A converter. If the analog input value exceeds the midscale output of the D/A converter, the MSB is set to a logical one. If, on the other hand, the analog input value is less than the midscale output of the D/A converter, the MSB is set to a logical zero. During the next conversion cycle, the analog input signal is compared with the ¼ scale or ¾ scale output of the D/A converter depending on the outcome of the first conversion cycle, and the second most significant bit is determined. Each conversion cycle progresses based on the previously determined bit until every bit in the digital output word is determined.

SUMMARY OF THE INVENTION

In accordance with an embodiment, a method of performing a successive approximation analog-to-digital (A/D) conversion includes determining a voltage range of an analog input voltage in a single cycle using a multi-bit flash A/D converter, determining an initial D/A value for a successive approximation based on determining the voltage range, and successively approximating the analog input voltage. Successively approximating includes providing the initial D/A value to a D/A converter, comparing an output of the D/A converter with the analog input voltage, and determining a further D/A value based on the comparing.

In accordance with a further embodiment, a successive approximation A/D converter includes a D/A converter configured to sum a D/A value to an analog input voltage, a first comparator coupled to an output of the D/A converter, a multi-bit comparator having an input coupled to the analog input voltage, and successive approximation logic. In an embodiment, the successive approximation logic includes a first input coupled to an output of the first comparator, a second input coupled to an output of the multi-bit comparator, a first output coupled to an input of the D/A converter, and a second output providing an output value of the successive approximation A/D converter. The successive approximation logic is configured to determine an initial value based on an output of the multi-bit comparator and perform a successive approximation of the analog input voltage by changing values of the first output starting with the initial value.

In an embodiment, an integrated circuit includes a capacitive D/A converter coupled to an analog voltage input and switchably coupled to a first reference voltage. The integrated circuit also includes a comparator, a multi-bit flash A/D converter and successive approximation logic. The comparator is coupled to an output of the capacitive D/A converter, and has an operational voltage range less than a full-scale output range of the capacitive D/A converter. The multi-bit flash A/D is coupled having an input voltage coupled to the analog voltage input, and the successive approximation logic is coupled to a multi-bit logic input of the capacitive D/A, the comparator and the multi-bit flash. In an embodiment, the successive approximation logic is configured to determine an initial D/A converter value based on an output of the multi-bit flash A/D, such that the initial value is determined such that a corresponding output voltage of the capacitive D/A converter is within an operational voltage range of the comparator. The successive approximation logic also provides the initial D/A converter value to the multi-bit logic input of the capacitive D/A converter, determines a further D/A converter value based on the output of the comparator after providing the initial D/A converter value, provides the further D/A converter value to the multi-bit logic input of the capacitive D/A converter.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a successive approximation A/D converter. The invention may also be applied to other types of data converters and electronic systems that perform measurements using successive approximation methods.

Figure 1:
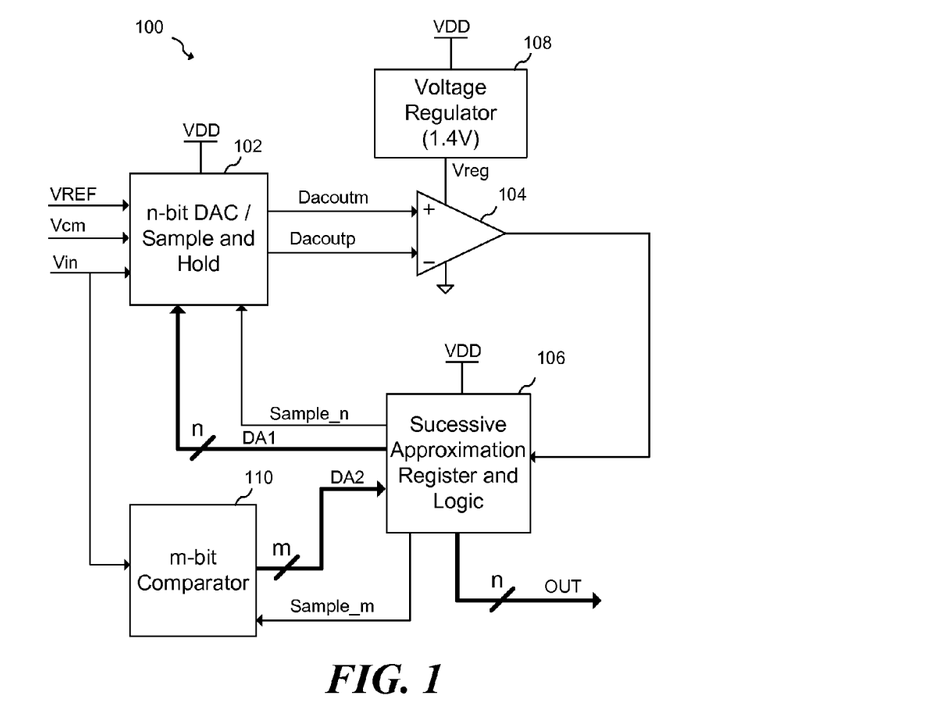
FIG. 1 illustrates an embodiment successive approximation A/D converter.

FIG. 1 illustrates successive approximation A/D converter 100 according to an embodiment of the present invention. A/D converter 100 has n-bit D/A and sample and hold block 102, comparator 104, m-bit comparator 110 and successive approximation register and logic 106. Comparator 104 may be referenced to voltage regulator 108 in order to provide a stable and accurate reference for the comparator. In one embodiment, n=12, and m=2, such that A/D converter 102 is a 12 bit D/A and m-bit comparator 104 is a two bit comparator. It should be appreciated that other values for n and m may be used in alternative embodiments.

In an embodiment A/D converter 100 has a supply voltage VDD that can range in voltage between 1.6 V and 3.6 V. By using voltage regulator 108, supply induced offset drift may be reduced or eliminated. In one embodiment voltage regulator 108 regulates the supply to comparator 104 to about 1.4 V, however, other regulated voltages may be used according to the particular embodiment and its specifications.

Successive Approximation Register and Logic block 106 provides signals Sample_n and n-bit D/A input word DA1 to D/A converter 102. In an embodiment, Successive Approximation Register and Logic block 106 pulses signal Sample_n that causes the D/A converter 102 to sample input voltage Vin. In succeeding time periods, Successive Approximation Register and Logic block 106 adjusts the value of D/A input word DA1 to approximate the value of input signal Vin. At the end of a conversion cycle, successive Approximation Register and Logic block 106 outputs the determined digital output voltage on n-bit output word OUT. In one embodiment, Successive Approximation Register and Logic block 106 has an n-bit successive approximation register coupled to control logic. This control logic may include a decoder.

In an embodiment, m-bit comparator performs an m-bit A/D conversion on input voltage Vin at the start of each conversion. In one embodiment, this m-bit A/D is performed in a single clock cycle. Successive Approximation Register and Logic block 106 determines an initial D/A conversion value for signal DA1 based on output DA2 of m-bit comparator 110. By determining an initial value for the D/A 102 based on input voltage Vin, the output swing of D/A output Dacoutm and Dacoutp may be reduced and a narrower input range for comparator 104 may be used. In some embodiments, A/D converter 100 may be implemented on an integrated circuit using, for example, a CMOS process. Alternatively, other process types may be used.

Figure 2:
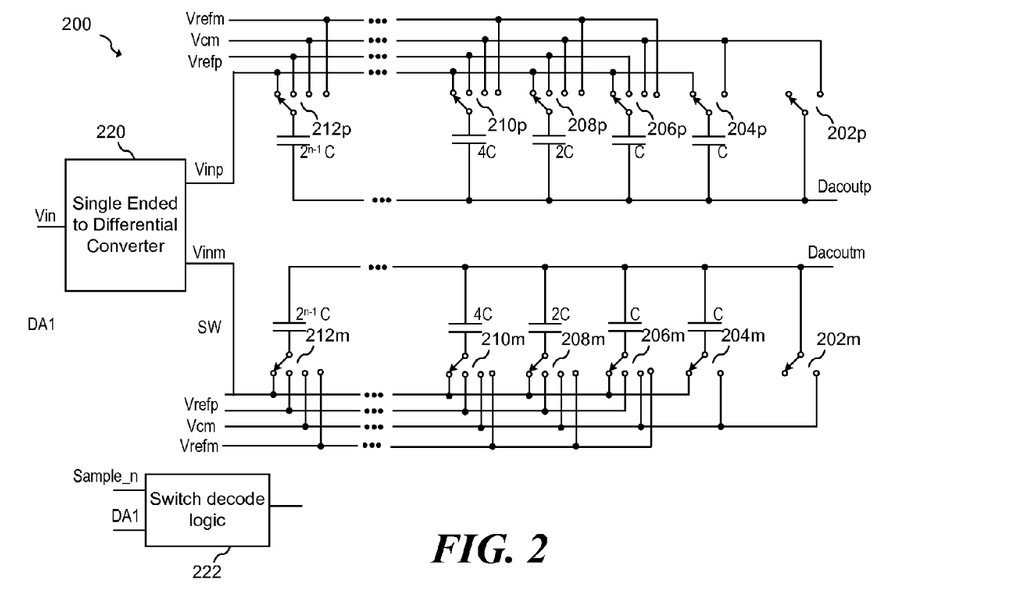
FIG. 2 illustrates an embodiment capacitive D/A converter.

In an embodiment D/A converter 102 is implemented using a differential capacitive D/A converter that performs both the sample and hold operation on input voltage Vin, as well as the D/A conversion operation. FIG. 2 illustrates D/A converter 200 according to an embodiment of the present invention. D/A 200 has single-ended to differential ended converter 220 that converts single-ended signal Vin to differential signal Vinp and Vinm, and binary weighted capacitor array coupled to bottom plate switches 204$p$, 204$m$, 206$p$, 206$m$, 208$p$, 208$m$, 210$p$, 210$m$, 212$p$ and 212$m$. In an embodiment, these switches may be implemented using NMOS, PMOS and/or CMOS transmission gates. Alternatively, other structures may be used. The binary weighted capacitor array may be implemented using capacitor structures known in the art, such as poly-poly capacitors, gate oxide capacitors, sandwich capacitors, and the like. Single-ended to differential conversion block 220 may be omitted, for example, if a differential input voltage is used, and may be implemented using circuits and structures known in the art. In an embodiment, the positive and negative portions of the binary weighted capacitor array each have n capacitors ranging in size from C to $2^{n-1}$C. In alternative embodiments, however, a single ended capacitive D/A or other D/A architecture may be used. In an embodiment of the present invention, the binary weighted capacitor array may laid out using unit capacitors according using matching techniques known in the art, such as common centroid and dummy capacitor techniques. In an embodiment, switch decode logic 222 provides control signals for the bottom plate switches based on D/A input signal DA1 and sample signal Sample_n. Switch decode logic 222 may be implemented using decoders and other logic circuits known in the art.

During the operation of the A/D converter, input voltage VIN is first sampled by closing switches 202$p$ and 202$m$ and coupling the bottom plates of the array capacitors to voltages Vinp and Vinm via bottom plate switches 204$p$, 204$m$, 206$p$, 206$m$, 208$p$, 208$m$, 210$p$, 210$m$, 212$p$ and 212$m$ and coupling Dacoutp and Dacoutm to Vcm via switches 202$p$ and 202$m$. Next, switches 202$p$ and 202$m$ are then opened, and bottom plate switches 204$p$, 204$m$, 206$p$, 206$m$, 208$p$, 208$m$, 210$p$, 210$m$, 212$p$ and 212$m$ are used to couple the bottom plates of the array capacitors to various combinations of Vrefp and Vrefm to adjust Dacoutp and Dacoutm according to embodiment successive approximation methods. For example, switches 212$p$ and 212$m$ may couple the bottom plate of the $2^{n-1}$C capacitor in the positive array to Vrefp and the $2^{n-1}$C capacitor in the negative array to Vrefm. The remaining switches are configured such that the bottom plates of remaining capacitors in the positive array are coupled to Vrefm and the bottom places of remaining capacitors in the negative array are coupled to Vrefp. Differential output voltage Dacoutp and Dacoutm is then compared using comparator 104 to determine its polarity and switches 212$p$ and 212$m$ couple the bottom plates the $2^{n-1}$C capacitors Vrefp and Vrefm depending on the result of the comparison. This step is repeated for each capacitor pair until the conversion is complete.

In an embodiment, the D/A may preset the first few MSB's of the capacitive DAC depending on the output of m-bit comparator in order to keep the peak-to-peak swing of Dacoutp and Dacoutm within a useable range of comparator 104. Depending on the value of this m-bit coarse comparison, one or more pairs bottom plate switches are preset before starting successively approximating input voltage Vin.

Figure 3A:
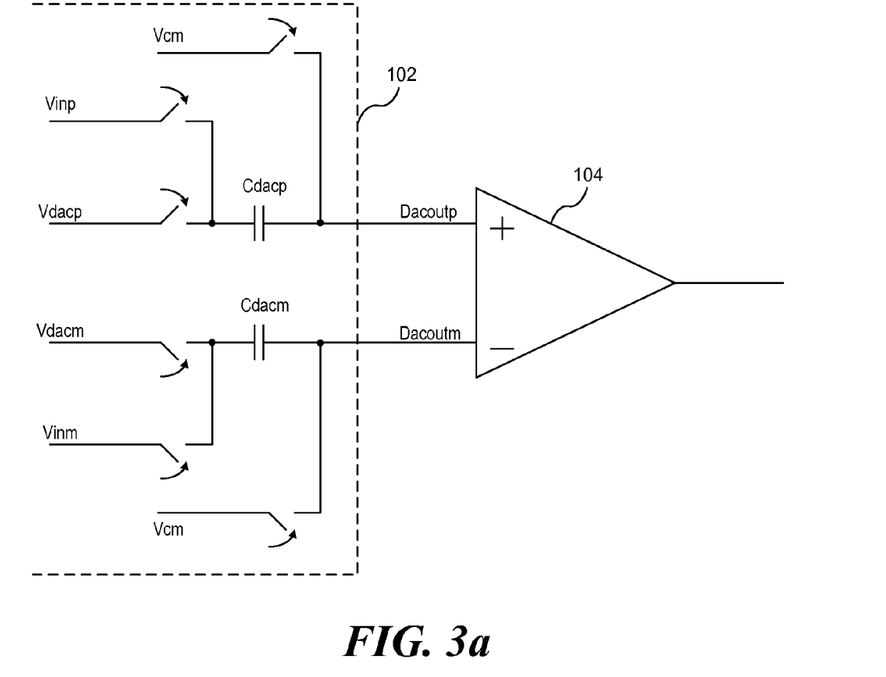
FIGS. 3a-3b illustrate an interface between the D/A converter and the comparator of the embodiment A/D converter.
Figure 3B:
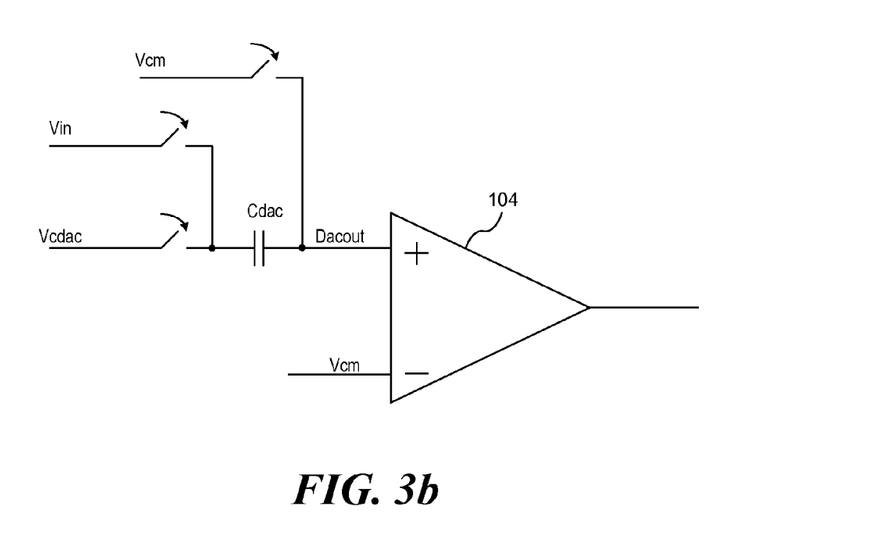

FIG. 3$a$ illustrates a detailed view of an interface between D/A 102 and comparator 104. Capacitors Cdacp and Cdacm represent the array capacitance of the positive and negative capacitor array within D/A 102, and Vdacp and Vdacm represent an equivalent bottom plate capacitor voltage based on the state of the bottom plate switches. FIG. 3$b$ represents a single ended version of the interface of FIG. 3$b$ for use in the following analysis.

In FIG. 3$a$, the output swing for signal Dacout traverses the full rail-to-rail voltage range when a standard successive approximation algorithm is used. If comparator 104 has a minimum input voltage requirement, there may be regions of operation where the comparator may not operate accurately under low voltage conditions. For example if the supply voltage is 1.6V, Vcm is set VDD/2=0.8V, and the comparator has a minimum operating voltage determined by the threshold voltage of an NMOS input stage, the comparator may have difficulty operating at the common mode voltage of 0.8V. Even if the comparator functions under nominal conditions, short-term negative bias temperature instability (NBTI) and short term positive bias temperature instability (PBTI) may affect the accuracy of the comparator, thereby causing non-linearity in the resulting conversions.

One way that this issue has been dealt with is by adding parasitic capacitance to the inputs of the comparator in order to attenuate and reduce the input voltage swing seen by the input of comparator 104. In this case the comparator input swing may be expressed as:

$$Vsupply * Cdac/(Cdac+Cp),$$

where Vsupply represents the rail to rail D/A output voltage, Cdac represents the D/A array capacitance, and Cp represents the additional parasitic capacitance coupled to the input of comparator 104. In some cases, however, as the input to the comparator is reduced, there may be corresponding increase in the sensitivity requirements of the comparator with respect to noise and offset. Furthermore, increasing Cp may also reduce the speed at which the output of D/A settles.

In an embodiment, output Dacout of D/A 102 can be expressed as:

$$Dacout = Vcm + Vcdac - Vin, \quad (1)$$

where Vcm is common mode input voltage of comparator 104, Vcdac is the converted analog voltage of D/A 102, and Vin is the analog input voltage sampled by A/D 100.

In an embodiment, Vcm is set to about 0.7V, which may limit the swing of D/A converter 102 to be between about 0V and the regulated supply voltage of about 1.4V. Another way this input range may be expressed is:

$$Vcdac - Vin \text{ to } +/-0.7V. \quad (2)$$

In some embodiments, however, the output range of D/A 102 exceeds this range, especially at higher supply voltages. For example, the maximum output swing of D/A 102 occurs in the first SAR conversion cycle, where Vcdac is Vref/2, and Vref is about equal to supply voltage VDD. In one example, when VDD=3.6V, $$Dacout = 0.7 + 1.8 - Vin = 2.5 - Vin. \quad (3)$$

Therefore, according to the condition given by equation (3), if Vin is between about 1.1V and about 1.4V, Dacout will be between 0V and 1.4V. If, Vin is outside of this range, output Dacout of D/A 102 may be outside of this range.

Figure 4A:
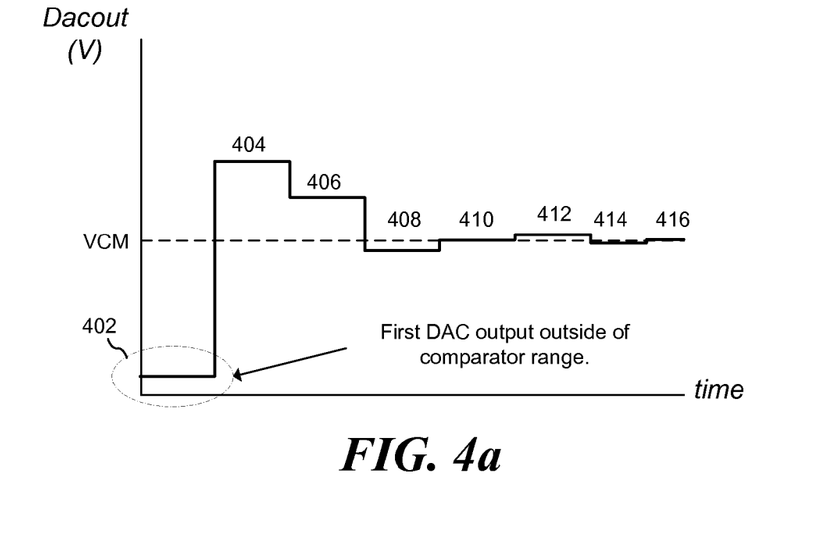
FIGS. 4a-4b illustrate waveforms associated with the embodiment A/D converter.

Turning to FIG. 4a, a waveform diagram showing output Dacout of D/A converter 102 during a sample successive approximation cycle is illustrated. During the first approximation cycle 402, Dacout exceeds 1.4V. In succeeding cycles 404, 406, 408, 410, 412, 414, and 416, however, Dacout is within the comparator input range of between 0V and about 1.4V.

In an embodiment of the present invention, m-bit comparator 104 is used to determine the input range of Vin. If Vin is determined to be in a range that causes D/A 102 to output a voltage outside of the operational range of comparator 104, the first MSB's of the successive digital output word are determined and the corresponding bits in D/A 102 are preset in order to keep output Dacout of D/A converter 102 within the operational range of comparator 104.

Figure 4B:
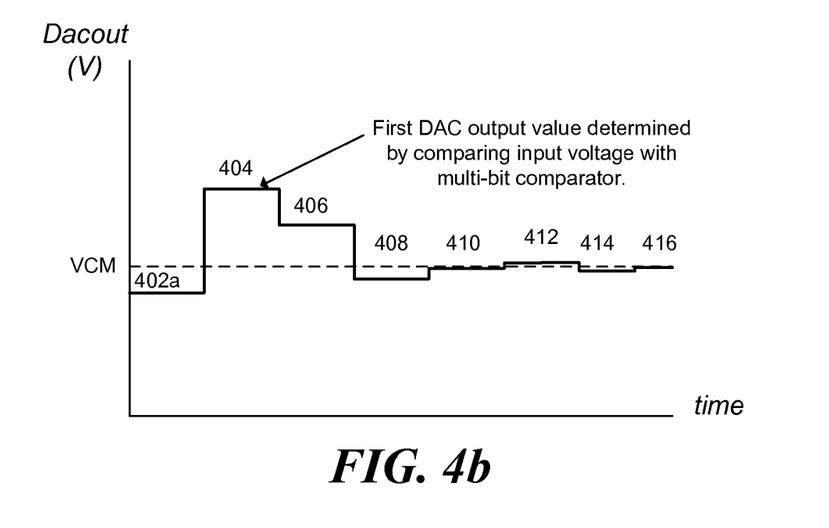

As illustrated in FIG. 4b, during Vin measurement phase 402a, comparator 104 determines the input range of Vin and the first few MSB's are present based on the determination. In the illustrated case, the first MSB phase is closer to the operational range of the comparator. The conversion proceeds with measurement phases 406, 408, 410, 412, 414 and 416 until the conversion is complete.

Figure 5A:
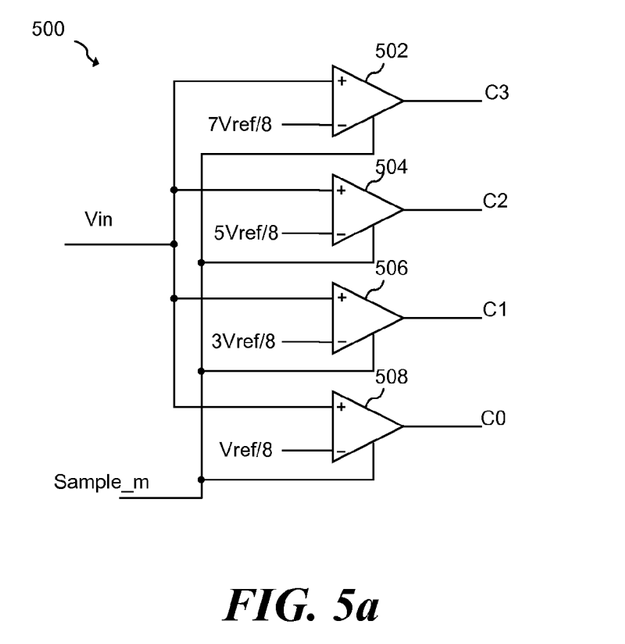
FIGS. 5a-5c illustrate schematics of an embodiment 2-bit comparator.

In an embodiment, m-bit comparator 104 is implemented as 2-bit comparator 500, as shown in FIG. 5a. In some embodiments, m-bit comparator 104 may be implemented as a flash A/D. M-bit comparator 500 has comparators 502, 504, 506, and 508, which are coupled to reference voltages 7Vref/8, 5Vref/8, 3Vref/8, and Vref/8, respectively. In one embodiment, Vref is set to be the supply voltage VDD. In some embodiments VDD may between about 1.6V and about 3.6V, however, in alternative embodiments other values may be used. Here, a coarse 2-bit converter is employed that manipulates the usual SAR algorithm by setting the MSBs in the first SAR conversion cycle so that the output swing is limited. In one embodiment, comparator 500 coarsely measures the input and accordingly manipulates the MSBs of D/A 102 (FIG. 1) in first SAR cycle. In one embodiment, if Vin is less than 1.1V or greater than 2.5V, the first few MSB's are determined such that D/A 102 output voltage Dacout is maintained between about 0V and about 1.4V before the start of the successive approximation measurement cycle.

Figure 5B:
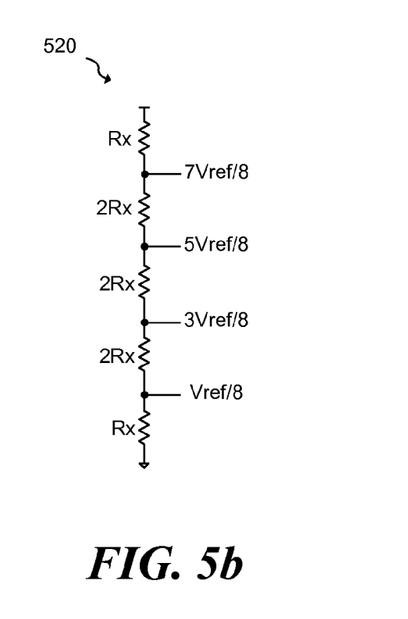

FIG. 5b illustrates an embodiment resistor ladder 520 that generates reference voltages 7Vref/8, 5 Vref/8, 3Vref/8, and Vref/8 for comparators 502, 504, 506 and 508. In one embodiment Rx, is about 10 kΩ, however, in alternative embodiments, other values or other components, such as capacitors, may be used. In further alternative embodiments of the present invention, other reference voltage generation circuit's known in the art may be used to generate 7Vref/8, 5Vref/8, 3Vref/8, and Vref/8.

Figure 5C:
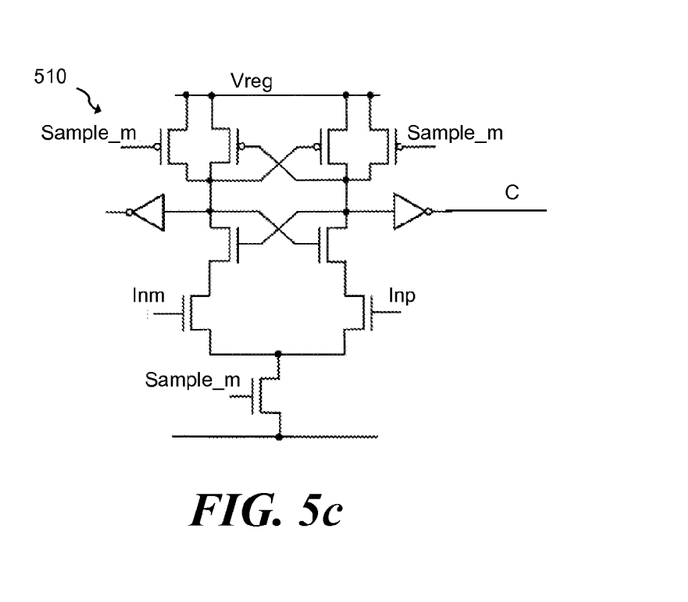

FIG. 5c illustrates latched comparator 510 that may be used for comparators 502, 504, 506 and 508. Latched comparator 510 has an NMOS differential pair input loaded with a cross-coupled latch. The comparator is latched when signal Sample_m goes high. Alternatively, other structures known in the art may be used, such as a dynamic latch or other type of comparator. It should be appreciated that, because of the relaxed offset requirements, very small structures operating at low power may be used.

Figure 6:
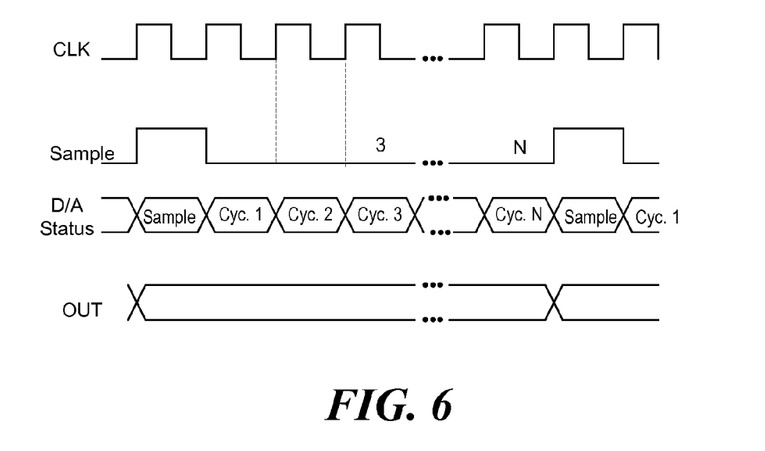
FIG. 6 illustrates a timing diagram of an embodiment A/D converter.

FIG. 6 illustrates a timing diagram of a conversion cycle of an embodiment A/D converter. Signal CLK represents a system clock, signal Sample represents a sampling signal sent to D/A 102 and m-bit comparator 110, D/A status represents the status of the D/A converter and signal OUT represents the output word of the A/D converter. At the beginning of a conversion cycle, signal Sample goes high and causes D/A 102 to sample the input voltage as well as causing m-bit comparator 110 to determine the input range of Vin. In the next N cycles, the D/A converter supplied values that successively approximate the input voltage Vin.

Figure 7:
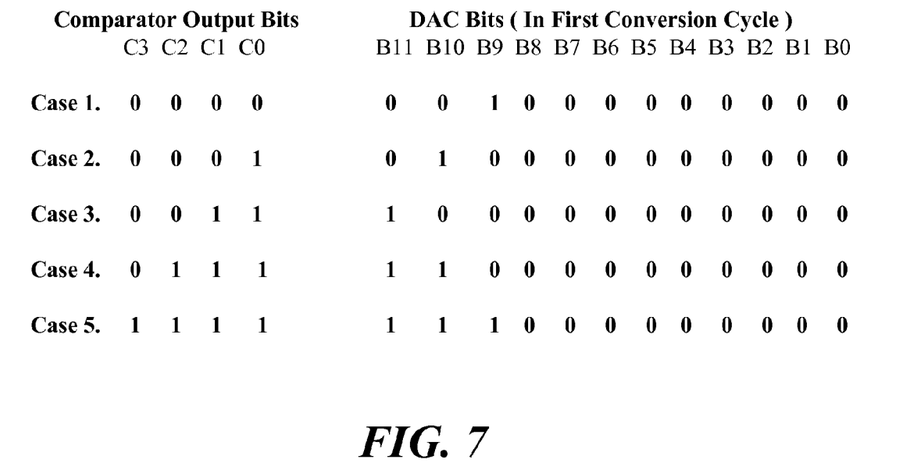
FIG. 7 illustrates an embodiment logic mapping of first conversion cycle DAC bits versus comparator output.

FIG. 7 illustrates an embodiment mapping of the output of comparator 500 with the pre-set D/A bits prior to the first successive approximation cycle. In an embodiment, the operation of the successive approximation A/D converter proceeds according to five embodiment cases: Case 1, Case 2, Case 3, Case 4 and Case 5. In an embodiment, these cases are implemented by successive approximation register and logic block 106 (FIG. 1.)

In an embodiment, Case 1 is defined as:

$$Vin < \frac{Vref}{8} \pm Voff,$$

where $V_{off}$ is the offset of the comparator. Case 1 corresponds to the situation where outputs C0, C1, C2 and C3 of comparators 508, 506, 504 and 502 (FIG. 5a) are not active. Here, an assumption is made that:

$Vin<Vref/4$, as long as $$V_{off} < \frac{Vref}{4} - \frac{Vref}{8}.$$

In this case, the two MSB's are assumed to be zero, with a comparator offset margin of Vref/4. Therefore, the first SAR cycle starts with two MSBs already set to zero and the third MSB initialized to one. For, example, the DAC bit configuration is set to 001000000000. The SAR algorithm then commences starting in the third cycle. Since, $$V_{cdac} - Vin = \frac{Vref}{8} - Vin,$$

Dacout is limited to Vcm to Vcm+Vref/8 which is less than 1.4V in Case 1.

In an embodiment, Case 2 is defined as:

$$\left(\frac{Vref}{8} \pm Voff\right) < Vin < \left(\frac{3Vref}{8} \pm Voff\right)$$

where $V_{off}$ is the offset of the comparator. Case 2 corresponds to the situation where the output C0 of comparator 508 (FIG. 5a) is active, while the remaining comparators 502, 504 and 506 are not active. Here, an assumption is made that:

$Vin<Vref/2$, as long as $$V_{off} < \frac{Vref}{2} - \frac{3Vref}{8}.$$

In this case, the first MSB is assumed to be zero, with a comparator offset margin of Vref/8. Therefore, the first SAR cycle starts the first MSB already set to zero and the second MSB initialized to one. For, example, the DAC bit configuration is set to 010000000000. The SAR algorithm then commences starting in the second cycle. Since, $$V_{cdac} - Vin = \frac{Vref}{4} - Vin,$$

Dacout is limited to between about to $$Vcm - \frac{Vref}{8} - Voff$$

and about $$Vcm + \frac{Vref}{8} + Voff$$

which is less than 1.4V.

In an embodiment, Case 3 is defined as:

$$\left(\frac{3Vref}{8} \pm Voff\right) < Vin < \left(\frac{5Vref}{8} \pm Voff\right)$$

where $V_{off}$ is the offset of the comparator. Case 3 corresponds to the situation where outputs C0 and C1 of comparators 508 and 506 (FIG. 5a) is active, while remaining comparators 502 and 504 are not active. In such a case, Dacout will be between 0 and 1.4V. Therefore, the normal SAR algorithm is implemented with the initial DAC configuration set to DAC bit configuration is set to 100000000000.

In an embodiment, Case 4 is defined as:

$$\left(\frac{5Vref}{8} \pm Voff\right) < Vin < \left(\frac{7Vref}{8} \pm Voff\right)$$

where $V_{off}$ is the offset of the comparator. Here, an assumption is made that:

$Vin<Vref/2$, as long as $$V_{off} < \frac{5Vref}{8} - \frac{Vref}{2}.$$

In this case, the first MSB is assumed to be one, with a comparator offset margin of Vref/4. Case 4 corresponds to the situation where outputs C0, C1 and C3 of comparators 508, 506 and 504 (FIG. 5a) are active, while remaining comparator 504 is not active. Therefore, the first SAR cycle starts the first MSB already set to one and the second MSB initialized to one. For, example, the DAC bit configuration is set to 110000000000. The SAR algorithm then commences starting in the second cycle. Since, $$V_{cdac} - Vin = \frac{3Vref}{4} - Vin,$$

Dacout is limited to between about to $$Vcm - \frac{Vref}{8} - Voff$$

and about $$Vcm + \frac{Vref}{8} + Voff$$

which is less than 1.4V.

In an embodiment, Case 5 is defined as:

$$Vin > \left(\frac{7Vref}{8} \pm Voff\right),$$

where $V_{off}$ is the offset of the comparator. Here, an assumption is made that:

$$Vin > 3 Vref/4, \text{ as long as}$$

$$V_{off} < \frac{7Vref}{8} - \frac{3Vref}{4}.$$

In this case, the two MSB's are assumed to be one, with a comparator offset margin of Vref/8. Case 4 corresponds to the situation where outputs C0, C1, C3 and C4 of comparators 508, 506, 504 and 502 (FIG. 5a) are all active. Therefore, the first SAR cycle starts with two MSBs already set to one and the third MSB initialized to one. For, example, the DAC bit configuration is set to 111000000000. The SAR algorithm then commences starting in the third cycle. Since, $$V_{cdac} - Vin = \frac{7Vref}{8} - Vin,$$

Dacout is limited to Vcm to Vcm+Vref/8 which is less than 1.4V.

It should be appreciated that the use of two-bit comparator 502 is just one example of many possible embodiments of the present invention. In alternative embodiments, the number of bits of comparator 500 may be extended in order to provide finer granularity with respect to determining the first few MSB of the successive approximation cycle. It should be further appreciated that embodiments of the present invention may be applied to successive approximation converters that use different D/A converter architectures, for example, current D/A's, R-2R ladder based D/A's, and the like. Alternative embodiments may also include A/D converters that have greater or fewer than the 12 bits shown in the embodiment examples.

Figure 8:
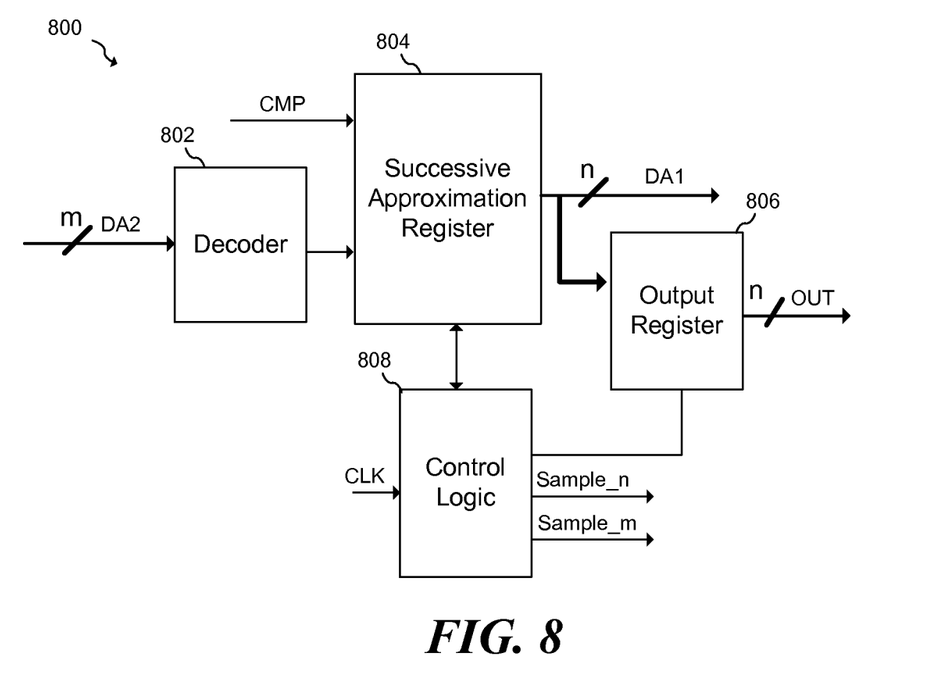
FIG. 8 illustrates an embodiment successive approximation logic block.

FIG. 8 illustrates an embodiment successive approximation logic block 800 that implements embodiment successive approximation algorithms. Successive approximation logic block has decoder 802, successive approximation register 804, output register 806 and control logic 808. In an embodiment, successive approximation logic block has decoder 802 that comprises an n-bit register that stores D/A input values during the course of the conversion. Output register 806 is clocked when a conversion is complete, thereby providing output digital word OUT. Decoder 802 maps the output of the m-bit comparator to an initial value in successive approximation register 804 prior to the beginning of a conversion. In one embodiment, decoder 802 provides the mapping shown in FIG. 7. Control logic 808 provides clocking and control logic for other blocks and may include, for example, one or more finite state machines for generating clocks, sampling signal Sample_n for the D/A converter, and signal Sample_m for the m-bit comparator, as well as other functions. Alternatively, other logical circuits may be used to implement the functionality of the successive approximation logic block.

In accordance with an embodiment, a method of performing a successive approximation analog-to-digital (A/D) conversion includes determining a voltage range of an analog input voltage in a single cycle using a multi-bit flash A/D converter, determining an initial digital-to-analog (D/A) value for a successive approximation based on determining the voltage range, and successively approximating the analog input voltage. Successively approximating includes providing the initial D/A value to a D/A converter, comparing an output of the D/A converter with the analog input voltage, and determining a further D/A value based on the comparing.

In an embodiment, determining the initial D/A value includes determining the initial D/A value such that an initial D/A output corresponding to the initial D/A value is less than a full-scale output range of the D/A converter. Comparing the output may include using a comparator having an input range that is less than a full-scale range of the D/A converter. In some embodiment, determining the initial D/A value further includes determining a D/A initial D/A value such that the initial D/A value is within the input range of the comparator. In embodiment, the method further includes regulating a supply a supply voltage of the comparator to a first voltage, where the first voltage being less than a reference voltage of the D/A converter.

In some embodiments, determining the initial D/A value includes determining one of a plurality of voltage ranges based on an output of the multi-bit flash A/D converter, and adjusting one or more most significant bits of the initial D/A value based on the determined one of the plurality of voltage ranges. If the determined voltage range is within a first voltage range, a most significant bit of the initial D/A value is set to a first state and remaining bits of the initial D/A value are set to a second state. On the other hand, if the determined voltage range is outside the first voltage range, one more of the most significant bits are set to states that map the initial D/A output to be within a first D/A output range, where the first D/A output range is less than the full-scale output range of the D/A converter.

In an embodiment, the method further includes operating a capacitive D/A converter, which includes sampling the analog input voltage on an array capacitance of D/A converter, and switching voltages coupled to the array capacitance based on the D/A values after sampling the analog input voltage. Comparing the output of the D/A converter with the analog input voltage may include coupling the array capacitance to a comparator.

In accordance with a further embodiment, a successive approximation A/D converter includes a D/A converter configured to sum a D/A value to an analog input voltage, a first comparator coupled to an output of the D/A converter, a multi-bit comparator having an input coupled to the analog input voltage, and successive approximation logic. In an embodiment, the successive approximation logic includes a first input coupled to an output of the first comparator, a second input coupled to an output of the multi-bit comparator, a first output coupled to an input of the D/A converter, and a second output providing an output value of the successive approximation A/D converter. The successive approximation logic is configured to determine an initial value based on an output of the multi-bit comparator and perform a successive approximation of the analog input voltage by changing values of the first output starting with the initial value. The successive approximation logic may be further configured determine the initial value to reduce an output swing of the D/A converter. The successive approximation A/D may be disposed on an integrated circuit.

In an embodiment, the successive approximation A/D converter also includes a voltage regulator providing a regulated voltage to a supply voltage input of the first comparator. In some embodiments, the regulated voltage is lower than a reference voltage of the D/A converter. The D/A converter may have a first full scale output range, and the first comparator may have an operational input range less the first full scale output range. In an embodiment, the successive approximation logic is configured determine the initial value to map D/A converter outputs within the operational input range of the first comparator.

In an embodiment, the D/A converter comprises a capacitive D/A converter. The D/A converter may include a plurality of binary weighted capacitor arrays and provide a differential output voltage.

In an embodiment, the multi-bit comparator includes a plurality of comparators coupled to a corresponding plurality of reference voltages. In one embodiment, each of the plurality of comparators may be implemented using a dynamic latch.

In an embodiment, an integrated circuit includes a capacitive D/A converter coupled to an analog voltage input and switchably coupled to a first reference voltage. The integrated circuit also includes a comparator, a multi-bit flash A/D converter and successive approximation logic. The comparator is coupled to an output of the capacitive D/A converter, and has an operational voltage range less than a full-scale output range of the capacitive D/A converter. The multi-bit flash A/D is coupled having an input voltage coupled to the analog voltage input, and the successive approximation logic is coupled to a multi-bit logic input of the capacitive D/A, the comparator and the multi-bit flash. In an embodiment, the successive approximation logic is configured to determine an initial D/A converter value based on an output of the multi-bit flash A/D, such that the initial value is determined such that a corresponding output voltage of the capacitive D/A converter is within an operational voltage range of the comparator. The successive approximation logic also provides the initial D/A converter value to the multi-bit logic input of the capacitive D/A converter, determines a further D/A converter value based on the output of the comparator after providing the initial D/A converter value, provides the further D/A converter value to the multi-bit logic input of the capacitive D/A converter.

In an embodiment, the comparator is coupled to a supply voltage having a voltage less than the first reference voltage. In some embodiments, the integrated circuit also includes a voltage regulator having an output coupled to the supply voltage of the comparator.

Advantages of embodiments of the present invention that reduce the output swing of the D/A converter include the ability to perform an accurate successive approximation A/D conversion under low operating voltage conditions while operating a comparator at a regulated voltage to minimize offset drift with supply voltage, while allowing the input voltage and D/A converter to operate at full signal levels. In some embodiments, these advantages are gained with a very low increase in power and circuit area because the offset margin of the comparators used have a very relaxed offset margin. For example, one embodiment, the offset margin is Vref/8.

A further advantage of some embodiments include the flexibility to choose the input common mode value of the comparator in the successive approximation A/D since the comparator input swing may be limited such that the input to the comparator does not exceed the operating range and/or regulated supply of the comparator.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of performing a successive approximation analog-to-digital (A/D) conversion, the method comprising:
   determining a voltage range of an analog input voltage in a single cycle using a multi-bit flash A/D converter;
   determining an initial digital-to-analog (D/A) value for a successive approximation based on determining the voltage range; and
   successively approximating the analog input voltage, successively approximating comprising:
      providing the initial D/A value to a D/A converter,
      comparing an output of the D/A converter with the analog input voltage,
      determining a further D/A value based on the comparing.

2. The method of claim 1, wherein determining the initial D/A value comprises determining the initial D/A value such that an initial D/A output corresponding to the initial D/A value is less than a full-scale output range of the D/A converter.

3. The method of claim 2, wherein comparing the output comprises using a comparator having an input range that is less than a full-scale range of the D/A converter.

4. The method of claim 2, wherein determining the initial D/A value further comprises determining the initial D/A value such that the initial D/A value is within the input range of the comparator.

5. The method of claim 2, further comprising, regulating a supply voltage of the comparator to a first voltage, the first voltage being less than a reference voltage of the D/A converter.

6. The method of claim 2, wherein determining the initial D/A value comprises:
   determining one of a plurality of voltage ranges based on an output of the multi-bit flash A/D converter; and
   adjusting one or more most significant bits of the initial D/A value based on the determined one of the plurality of voltage ranges.

7. The method of claim 6, wherein:
   if the determined voltage range is within a first voltage range, setting a most significant bit of the initial D/A value to a first state and setting remaining bits of the initial D/A value to a second state; and
   if the determined voltage range is outside the first voltage range, setting one more of the most significant bits to states that map the initial D/A output to be within a first D/A output range, the first D/A output range being less than the full-scale output range of the D/A converter.

8. The method of claim 1, wherein the method further comprises operating a capacitive D/A converter, operating the D/A converter comprising:
   sampling the analog input voltage on an array capacitance of D/A converter; and
   switching voltages coupled to the array capacitance based on the D/A values after sampling the analog input voltage, wherein comparing the output of the D/A converter with the analog input voltage comprises coupling the array capacitance to a comparator.

9. A successive approximation analog-to-digital (A/D) converter comprising:
   a digital-to-analog (D/A) converter configured to sum a D/A value to an analog input voltage;
   a first comparator coupled to an output of the D/A converter;
   a multi-bit comparator having an input coupled to the analog input voltage; and successive approximation logic comprising
a first input coupled to an output of the first comparator,
a second input coupled to an output of the multi-bit comparator,
a first output coupled to an input of the D/A converter;
a second output providing an output value of the successive approximation A/D converter, wherein the successive approximation logic configured to
determine an initial value based on an output of the multi-bit comparator, and
perform a successive approximation of the analog input voltage by changing values of the first output starting with the initial value.

10. The successive approximation A/D converter of claim 9, wherein the successive approximation logic is configured determine the initial value to reduce an output swing of the D/A converter.

11. The successive approximation A/D converter of claim 9, further comprising:
a voltage regulator providing a regulated voltage to a supply voltage input of the first comparator.

12. The successive approximation A/D converter of claim 11, wherein the regulated voltage is lower than a reference voltage of the D/A converter.

13. The successive approximation A/D converter of claim 9, wherein:
the D/A converter comprises a first full scale output range; and
the first comparator comprises an operational input range less the first full scale output range.

14. The successive approximation A/D converter of claim 13, wherein the successive approximation logic is configured determine the initial value to map D/A converter outputs within the operational input range of the first comparator.

15. The successive approximation A/D converter of claim 9, wherein the D/A converter comprises a capacitive D/A converter.

16. The successive approximation A/D converter of claim 15, wherein:
the capacitive D/A converter comprises a plurality of binary weighted capacitor arrays, and
the capacitive D/A converter provides a differential output voltage.

17. The successive approximation (A/D) converter of claim 15, wherein the capacitive (D/A) converter is coupled to the analog input voltage and is switchably coupled to a first reference voltage.

18. The successive approximation (A/D) converter of claim 17, wherein the multi-bit comparator comprises a multi-bit flash analog-to-digital (A/D) converter.

19. The successive approximation (A/D) converter of claim 18, wherein the successive approximation logic is configured to:
determine the initial value based on an output of the multi-bit flash A/D converter, wherein the initial value is determined such that a corresponding output voltage of the capacitive D/A converter is within an operational voltage range of the first comparator,
provide the initial value to a multi-bit logic input of the capacitive D/A converter;
determine a further D/A converter value based on the output of the first comparator after providing the initial D/A converter value; and
provide the further D/A converter value to the multi-bit logic input of the capacitive D/A converter.

20. The successive approximation (A/D) converter of claim 19, wherein the first comparator is coupled to a supply voltage having a voltage less than the first reference voltage.

21. The successive approximation (A/D) converter of claim 20, further comprising a voltage regulator comprising an output coupled to the supply voltage of the comparator.

22. The successive approximation A/D converter of claim 9, wherein the multi-bit comparator comprises a plurality of comparators coupled to a corresponding plurality of reference voltages.

23. The successive approximation A/D converter of claim 22, wherein each of the plurality of comparators comprises a dynamic latch.

24. The successive approximation A/D converter of claim 22, wherein the successive approximation A/D is disposed on an integrated circuit.

* * * * *

UNITED STATES PATENT AND TRADEMARK OFFICE
CERTIFICATE OF CORRECTION

PATENT NO. : 8,587,466 B2  
APPLICATION NO. : 13/339778  
DATED : November 19, 2013  
INVENTOR(S) : Chandrajit Debnath

Page 1 of 1

It is certified that error appears in the above-identified patent and that said Letters Patent is hereby corrected as shown below:

In the Claims

In Col. 13, line 16, claim 10, delete "determine" and insert --to determine--.

Signed and Sealed this  
Seventh Day of January, 2014

Margaret A. Focarino  
*Commissioner for Patents of the United States Patent and Trademark Office*